(12) United States Patent
Outram

(10) Patent No.: US 6,424,277 B1
(45) Date of Patent: Jul. 23, 2002

(54) AC CALIBRATION APPARATUS

(75) Inventor: John Outram, Bosham (GB)

(73) Assignee: Outram Research Ltd., Bosham (GB)

( * ) Notice: Subject to any disclaimer, the term of this patent is extended or adjusted under 35 U.S.C. 154(b) by 0 days.

(21) Appl. No.: 09/454,556

(22) Filed: Dec. 7, 1999

(30) Foreign Application Priority Data

Dec. 7, 1998 (GB) .............................................. 9826891

(51) Int. Cl.[7] .............................................. H03M 1/10
(52) U.S. Cl. ..................................... 341/120; 341/118
(58) Field of Search ................................ 341/118, 120, 341/155; 374/132, 133

(56) References Cited

U.S. PATENT DOCUMENTS

| | | | | |
|---|---|---|---|---|
| 3,581,212 A | * | 5/1971 | McMurray | 328/14 |
| 3,745,556 A | * | 7/1973 | Dorey | 340/347 |
| 4,415,927 A | | 11/1983 | Penney | |
| 4,584,566 A | * | 4/1986 | Arcara | 340/347 |
| 5,150,969 A | * | 9/1992 | Goldberg et al. | 374/128 |
| 6,045,257 A | * | 4/2000 | Pompei et al. | 374/132 |

* cited by examiner

Primary Examiner—Peguy JeanPierre
Assistant Examiner—Joseph Lauture
(74) Attorney, Agent, or Firm—Foley, Hoag & Eliot LLP

(57) ABSTRACT

AC calibration apparatus (2) comprising an analogue to digital converter (4), and in which the absolute gain of the analogue to digital converter (4) is dynamically assessed by applying a reference AC signal which is in addition to a sampling signal required for measurement purposes and which is a square wave of a known amplitude at a precise sub-harmonic of the sampling frequency of the analogue to digital converter (4).

12 Claims, 1 Drawing Sheet

AC CALIBRATION APPARATUS

FIELD OF THE INVENTION

This invention relates to AC calibration apparatus.

BACKGROUND OF THE INVENTION

Various methods are in use world wide for the accurate measurement of AC mains voltage or current, and attendant quality such for example as power metering and power quality measurement. One known method involves taking multiple samples of an input wave (voltage or current) during a mains cycle, converting each sample to digital form with an analogue to digital converter, and performing mathematical operations on the results to accurately assess root mean square voltage (or current) or any other parameter which may be desirable. In one class of known system, the samples are taken regularly at a rate Fs consistent with sampling theory. The resultant digital values are transformed from a time domain to a frequency domain to yield more easily the desired parameters. In this known class of system and in other systems, the accuracy of the analogue to digital converter is crucial to the accuracy of the final result. One problem is that the absolute gain accuracy of the analogue to digital converter may vary with factors such for example as temperature or age. The dynamic variation of the analogue to digital converter gain is usually assessed in known apparatus by occasionally presenting a DC signal of known amplitude to the analogue to digital converter in place of the normal input signals, and using the corresponding converted digital value as a reference against which the AC measurements can be scaled.

The existing methods as described above cause problems in that system characteristics commonly affecting the desired AC signal but not the reference DC signal cannot be dynamically removed by the above described reference assessment process. AC calibration systems are also used but these are usually a final part of the production process employing external generators. Such AC calibration systems are either not economic or, if built-in, are not accurate enough to be useful for dynamic testing.

SUMMARY OF THE INVENTION

It is an aim of the present invention to obviate or reduce the above mentioned problems.

Accordingly, in one non-limiting embodiment of the present invention there is provided AC calibration apparatus comprising an analogue to digital converter, and in which the absolute gain of the analogue to digital converter is dynamically assessed by applying a reference AC signal which is in addition to a sampling signal required for measurement purposes and which is a square wave of a known amplitude at a precise sub-harmonic of the sampling frequency of the analogue to digital converter.

Thus, the present invention is able accurately to assess the gain of the analogue to digital converter in AC calibration apparatus by applying an AC signal of special characteristics at the same time as normal input sampling signals, and such that an accurate reference measurement is able to be made which is more representative of normal operation.

The AC calibration apparatus will normally be one in which the reference AC signal is applied at the same time as the sampling signal.

Preferably, the AC calibration apparatus is one in which the edge of the square wave is alternately aligned with the sampling signal such that the reference AC signal has a frequency of Fs/2.

Also preferably, the analogue to digital converter is a Sigma-Delta analogue to digital converter. Such Sigma-Delta analogue to digital converters have more difficulty with DC than AC, although some such Sigma-Delta to analogue digital converters do achieve good DC performance. However, they often require off-line offset measurement cycles to effectively calibrate out the offset imperfections. In the case of one known inexpensive Sigma-Delta analogue to digital converter, the inherent DC performance is immaterial because the manufacturer has chosen to digitally remove the long term DC part of any measurement. Thus, with such a converter in the AC calibration apparatus of the present invention, DC is actually rejected. This means that the input signal can be continuously measured, which is important in the present invention. If desired, a Sigma-Delta analogue to digital converter may be used which does pass DC, provided its off-line offset calibration process can either be suppressed, or does not deny time to the proper input signal measurement. The considerable advantage of the present invention is the independence of both DC offset and gain variation.

Generally, the AC calibration apparatus may be one in which the analogue to digital converter does not pass DC, and in which the analogue to digital converter also has an inherent input anti-alias digital filtering means which scales with sampling frequency. Because the analogue to digital converter does not pass DC, a DC reference signal cannot be employed. Since the inherent input anti-alias digital filtering means scales with sampling frequency, any attenuation of any related frequency is exactly known. Further, with certain analogue to digital converters, the attenuation which makes such analogue to digital converters easily usable at the preferred reference AC signal frequency of Fs/2. If such a frequency cannot conveniently be used, then the reference AC frequency may be Fs/4, but such a frequency may introduce more problems than the reference AC signal frequency Fs/2. The Sigma-Delta analogue to digital converters are especially preferred since they are relatively inexpensive to purchase.

The AC calibration apparatus may be one in which an input amplifier combines the sampling signal with the reference AC signal and then inputs the combined signals to the analogue to digital converter.

The AC calibration apparatus may be one in which the analogue to digital converter outputs to a processor, in which the processor outputs to a sampling frequency control system, and in which the sampling frequency control system outputs to the input amplifier via switched reference generation means. The switched reference generation means may include first and second switches arranged such that one switch is open when the other switch is closed and vice versa, in order to give a break before make operation.

An embodiment of the invention will now be described solely by a way of example and with reference to the accompanying drawings in which.

DETAILED DESCRIPTION OF THE INVENTION

Figure 1:
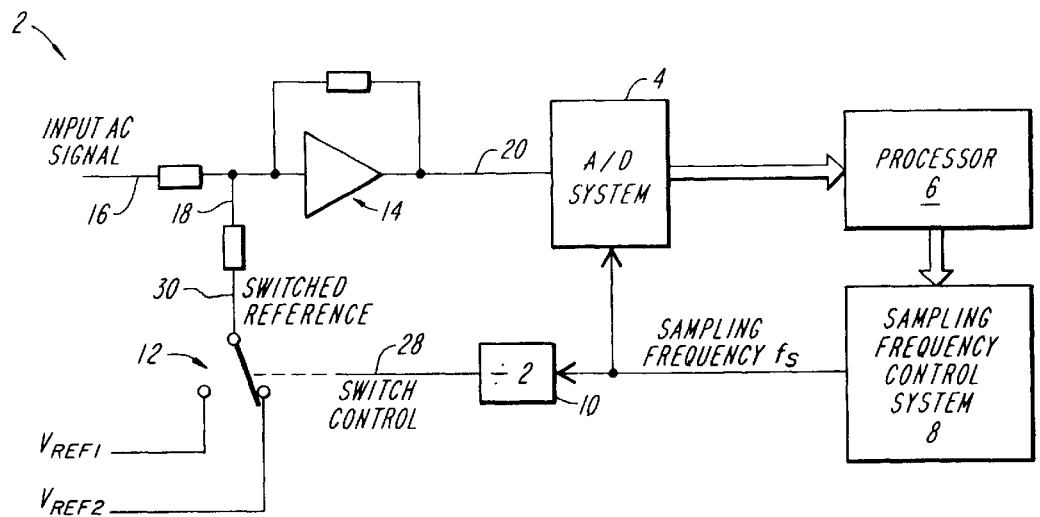
FIG. 1 illustrates a circuit for AC calibration apparatus.

Referring to FIG. 1, there is shown AC calibration apparatus 2 comprising an analogue to digital converter 4, a processor 6, a sampling frequency control system 8, divided-by-two means 10, and switched reference generation means 12. The AC calibration apparatus 2 further comprises an input amplifier 14 connected between the switched reference generation means 12 and the analogue to digital converter 4 as shown. Also as shown, the analogue to digital converter 4 outputs to the processor 6, which in turn outputs to the sampling frequency control system 8. The sampling frequency control system 8 outputs to the analogue to digital converter 4 and to the divide-by-two means 10 as shown.

The AC calibration apparatus 2 is such that the absolute gain of the analogue to digital converter 4 is dynamically assessed by applying a reference AC signal which is in addition to a sampling signal required for measurement purposes. The reference AC signal is a square wave which is of a known amplitude at a precise sub-harmonic of the sampling frequency of the analogue to digital converter. The input amplifier 14, which may be wide-band to pass cleanly the reference waveform, combines the input AC signal on line 16 with the reference AC signal on line 18. The combined signal then passes along line 20 to the analogue to digital converter 4.

Figure 2:
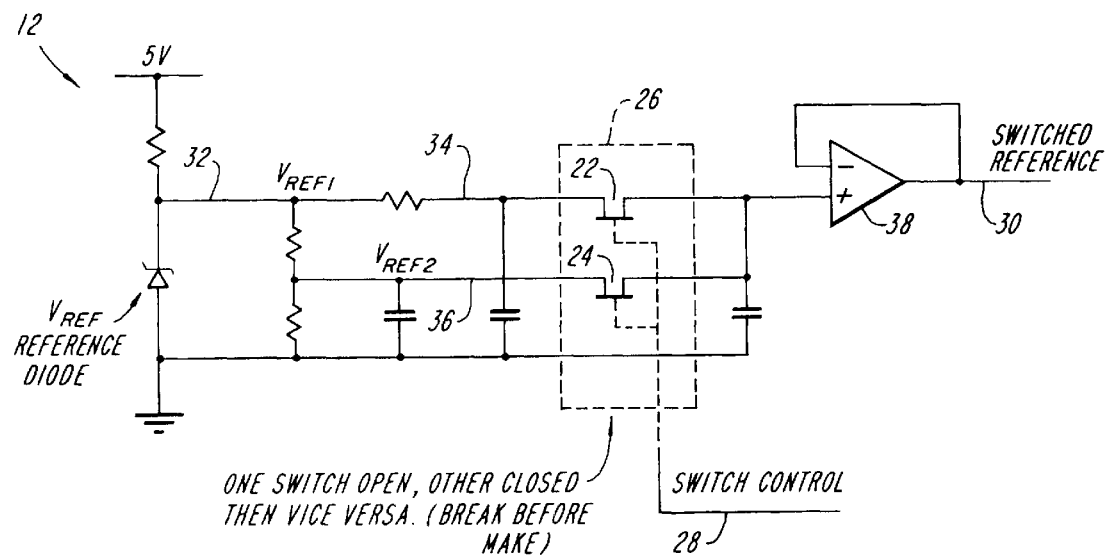
FIG. 2 shows a circuit for switched reference generation means employed in FIG. 1.

FIG. 2 shows an example of switched reference generation means 12. The switched reference generation means 12 has the illustrated circuit components. First and second switches 22, 24 respectively are such that one switch is open when the other switch is closed and vice versa. The first and second switches 22, 24 thus form a break before make devices 26 which is controlled by the switch control line 28 and which connects one of the two clean filtered reference lines 34 or 36 to the switched reference line 30 as shown. This particular arrangement has the additional benefit of providing the necessary reference level to the amplifier 38 and subsequently amplifier 14 and the analogue to digital converter 4, permitting the entire circuit to operate from a single supply. The switched reference line 18 may also be introduced on the non-inverting input side of amplifier 14 such that it provides a control/bias path in a differential amplifier configuration. The first and second switches 22, 24 may have low gate-drain and gate-source capacitance.

The reference AC signal is such that the edges of the square wave are alternately aligned with the sampling signal such that the square wave frequency is Fs/2. This enables the reference AC signal to be isolated or distinguished in the frequency domain for any system in which the number of samples processed is even, including Fast Fourier Transform based systems. An important benefit of this feature is that the normal input sampling signal measurements are unaffected by the presence of the reference wave, since the wanted characteristics of the input signal rarely extend to Fs/2 because Fs is deliberately chosen to be above 2* (twice) the highest wanted signal frequency, and the reference signal does not have any components at less than Fs/2. In addition, the reference wave may be applied at the same time as the normal input sample signals, so that time is not denied to normal input signal measurement. Hence the reference AC signal can, if desired, be present at all times, which in turn means that the reference AC signal can be small yet very accurately assessed with very little noise. In the event that input signal information extends up to the reference switching frequency and potentially corrupts reference signal measurements, the phase of the reference signal can be digitally manipulated to destroy any coherent corruption, and to permit long term averaging of the corruption to effectively zero.

The analogue to digital converter is an audio type Sigma-Delta analogue to digital converter which is a relatively cheap analogue to digital converter, which in turn enables the AC calibration apparatus of the present invention to be produced at a competitive manufacturing cost. The Sigma-Delta analogue to digital converter 4 is one that does not readily pass DC so that it is not possible to use a DC reference signal. The Sigma-Delta analogue to digital converter is also one that has an inherent input anti-alias digital filtering means, which scales with sampling frequency. This means that the attenuation at the related frequency of Fs/2 is exactly known. The attenuation is not great, which makes the Sigma-Delta analogue to digital converter usable.

It is to be appreciated that the embodiment of the invention described above with reference to the accompanying drawings has been given by way of example only that the modifications may be effected. Thus, for example, the reference AC signal may be Fs/4.

What is claimed is:

1. An AC calibration apparatus comprising
an analogue to digital converter, wherein the absolute gain of the analogue to digital converter is dynamically assessed by simultaneously applying to the analogue to digital converter a reference AC signal and a sampling signal required for measurement purposes, further wherein the reference AC signal is a square wave having a known amplitude at a precise subharmonic of the sampling frequency of the analogue to digital converter, and further wherein alternate edges of the square wave are precisely phase related to the sampling signal.

2. The apparatus of claim 1, in which the reference AC signal has a frequency of Fs/2.

3. The apparatus of claim 2, in which the analogue to digital converter is a Sigma-Delta analogue to digital converter.

4. The apparatus of claim 2, in which the analogue to digital converter does not pass DC, and in which the analogue to digital converter also has an inherent input anti-alias digital filtering means which scales with sampling frequency.

5. The apparatus of claim 4, further comprising an input amplifier which combines the sampling signal with the reference AC signal and then inputs the combined signals to the analogue to digital converter.

6. The apparatus of claim 5, in which the analogue to digital converter outputs to a processor, in which the processor outputs to a sampling frequency control system, and in which the sampling frequency control system outputs to the input amplifier via switched reference generation means.

7. The apparatus of claim 6, further comprising a switched reference generation means comprising first and second switches arranged such that one switch is open when the other switch is closed and vice versa, in order to give a break before making operation.

8. The apparatus of claim 1, in which the analogue to digital converter is a Sigma-Delta analogue to digital converter.

9. The apparatus of claim 1, in which the analogue to digital converter does not pass DC, and in which the analogue to digital converter also has an inherent input anti-alias digital filtering means which scales with sampling frequency.

10. The apparatus of claim 9, further comprising an input amplifier which combines the sampling signal with the reference AC signal and then inputs the combined signals to the analogue to digital converter.

11. The apparatus of claim 10, in which the analogue to digital converter outputs to a processor, in which the processor outputs to a sampling frequency control system, and in which the sampling frequency control system outputs to the input amplifier via switched reference generation means.

12. The apparatus of claim 11, further comprising a switched reference generation means comprising first and second switches arranged such that one switch is open when the other switch is closed and vice versa, in order to give a break before making operation.

* * * * *